(12) United States Patent
Boire et al.

(10) Patent No.: US 6,174,599 B1
(45) Date of Patent: Jan. 16, 2001

(54) GLAZING PANEL PROVIDED WITH A CONDUCTIVE AND/OR LOW EMISSIVITY FILM

(75) Inventors: Philippe Boire, Paris; Georges Zagdoun, La Garenne-Colombes, both of (FR)

(73) Assignee: Saint-Gobain Vitrage, Aubervilliers Cedex (FR)

(*) Notice: Under 35 U.S.C. 154(b), the term of this patent shall be extended for 0 days.

(21) Appl. No.: 08/793,605

(22) PCT Filed: Jul. 10, 1996

(86) PCT No.: PCT/FR96/01073

§ 371 Date: Apr. 4, 1997

§ 102(e) Date: Apr. 4, 1997

(87) PCT Pub. No.: WO97/03029

PCT Pub. Date: Jan. 30, 1997

(30) Foreign Application Priority Data

Jul. 12, 1995 (FR) .................................................. 95 08421

(51) Int. Cl.$^7$ ....................................................... B32B 7/00
(52) U.S. Cl. ........................ 428/336; 359/580; 359/582; 359/586; 359/589; 428/212; 428/426; 428/432; 428/698; 428/701; 428/702
(58) Field of Search ..................................... 428/212, 336, 428/426, 432, 698, 699, 701, 702; 359/580, 582, 586, 589

(56) References Cited

U.S. PATENT DOCUMENTS 4,187,336  2/1980  Gordon ................................. 428/34

FOREIGN PATENT DOCUMENTS

| 0 365 239 | 4/1990 | (EP) . |
|---|---|---|
| 0 365 240 | 4/1990 | (EP) . |
| 0 499 523 A1 | 8/1992 | (EP) . |
| 0 518 755 A1 | 12/1992 | (EP) . |
| 0 521 602 A1 | 1/1993 | (EP) . |
| 0 573 325 A1 | 12/1993 | (EP) . |
| 2348165 | 11/1977 | (FR) . |
| 2348166 | 11/1977 | (FR) . |
| 2456077 | 12/1980 | (FR) . |
| 2 015 983 | 9/1979 | (GB) . |
| WO 85/00555 | 2/1985 | (WO) . |
| WO 94/25410 | 11/1994 | (WO) . |

*Primary Examiner*—A. A. Turner
(74) *Attorney, Agent, or Firm*—Pennie & Edmonds LLP

(57) ABSTRACT

The subject of the invention is a glazing panel comprising a transparent substrate (1), especially one made of glass, provided with at least one functional, conductive and/or low-emissivity, transparent thin film (3). In order to improve the optical and especially the calorimetric appearance of the glazing panel, at least one intermediate film (2) is placed between the substrate (1) and the functional film (3), this at least one intermediate film having a refractive index gradient decreasing through its thickness.

The invention also relates to the device intended for manufacturing this type of glazing panel.

20 Claims, 6 Drawing Sheets

GLAZING PANEL PROVIDED WITH A CONDUCTIVE AND/OR LOW EMISSIVITY FILM

BACKGROUND OF THE INVENTION

The invention relates to a glazing panel comprising a glass substrate provided with a functional thin film, the latter exhibiting properties of transparency, electrical conductivity and/or low emissivity.

It also relates to the processes for obtaining such a glazing panel, in particular by means of pyrolysis or of techniques-using a vacuum.

This type of functional film is most particularly applicable for glazing panels intended for buildings: a glass substrate, coated with a low-emissivity film, makes it possible to reduce the emission in the far infrared through the glazing panel, of which it forms part, from inside the premises to the outside. By reducing the energy losses due partly to this radiation leakage, the comfort of the inhabitants is appreciably improved, especially in winter. The substrate thus coated and then combined with another substrate via a layer of gas, the low-emissivity film lying as face 3 (counting from the outermost face), constitutes a very efficient insulating double glazing.

These films are also applicable for glazing panels intended for motor vehicles because of their electrical conduction properties, for example in order to form heated windows by providing current leads.

Films of metal oxides exhibiting these properties are, for example, layers of tin-doped indium oxide (ITO), or aluminium-doped zinc oxide (Al:ZnO), indium-doped zinc oxide (In:ZnO), tin-doped zinc oxide (Sn:ZnO) or fluorine-doped zinc oxide (F:ZnO), or fluorine-doped tin oxide ($F:SnO_2$).

These metal oxide films may be obtained by various processes: by vacuum processes (thermal evaporation or sputtering, possibly using a magnetron) or by pyrolysis of organometallic compounds sprayed in liquid, solid or gas form by a carrier gas onto the surface of the glass substrate heated to a high temperature, but nevertheless one which is less than its softening temperature. These compounds, thus brought into contact with a hot surface, decompose, oxidizing to form a film of metal oxide on this surface. The latter technique is most particularly advantageous insofar as it makes it possible to envisage continuous deposition directly on the ribbon of glass in a float-type manufacturing line.

However, in order for these films to reach a high performance level, especially in terms of emissivity and/or electrical conduction values, their thickness must be at least 180 nm or indeed greater than 400 nm, and usually between 350 and 550 nm. A thin film having such thicknesses gives the substrate which it covers an appearance in reflection, especially a coloration, which may not be highly appreciated from an aesthetic standpoint.

Thus arises the problem of the appearance in reflection, most particularly of the residual coloration obtained, of the substrate coated in this way. This is because, according to the teaching of the patent EP-B-0,125,153, a film of fluorine-doped tin oxide $F:SnO_2$, the thickness of which is only approximately 163 to 165 nm, deposited on a clear float glass substrate 4 mm thick gives the latter a coloration in reflection in the blues, which coloration is currently greatly appreciated both in the building industry and in the motor-vehicle industry. On the other hand, it has been observed that a film of the same kind but this time having a thickness of 360 nm, and therefore a film having superior performance, gives the same substrate an appearance in reflection, "on the film side", in the greens/purples, which colour is not very desirable for aesthetic reasons.

Various technical solutions intended to improve the optical appearance of glazing panels provided with functional films having such characteristics have already been proposed. Thus, according to the teaching of the European Patent Application EP-A-0,573,325, a so-called "intermediate" coating is sandwiched between substrate and functional film, the optical thickness of which coating has been suitably selected so as to obtain a residual colour in reflection which is in the blues and is, additionally, not very intense. With the same purpose in mind, Patent Application WO-94/25410 proposes to place the functional film this time between two coatings, one called the "internal" coating and the other called the "external" coating, the combination of the choice of the thickness characteristics and of the refractive index of these two coatings widening the scope for finely adjusting the colorimetric appearance of the glazing panel in reflection.

SUMMARY OF THE INVENTION

The object of the invention is therefore to improve these stacks of thin films further by developing glazing panels which may both be provided with functional films exhibiting good thermal/electrical properties and which may exhibit an appearance in reflection which is as pleasing as possible to the eye, especially having, in reflection, a colour which is aesthetic, not very intense, barely reflective and stable.

The subject of the invention is also the development of a process for manufacturing these glazing panels, as well as that of the plant necessary for its implementation.

DETAILED DESCRIPTION OF THE INVENTION

Figure 1:
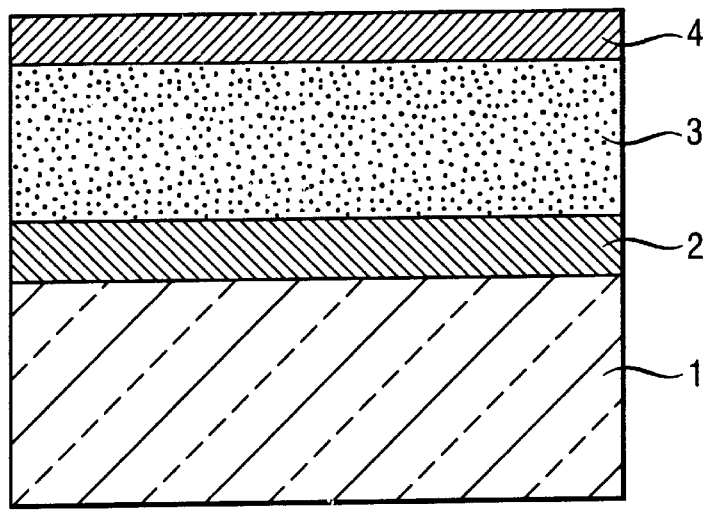
FIG. 1 is a cross-section through a glass substrate coated according to the invention.

The subject of the invention is firstly a glazing panel comprising a transparent substrate, especially one made of glass, provided with at least one functional transparent thin film. Within the context of the invention, "functional" film is understood to mean a film possessing electrical conduction properties and/or thermal properties, most particularly low-emissivity properties. In order to improve the optical appearance, especially with regard to colorimetry, of the glazing panel, at least one so-called "intermediate" film is placed between the substrate and this functional film, this at least one intermediate film having a decreasing refractive index gradient through its thickness. By "decreasing gradient" is meant, within the scope of the invention, the fact that the refractive index of the film decreases through its thickness progressively on going away from the surface of its carrier substrate.

According to a preferred embodiment, there is furthermore deposited on the functional film at least one so-called "external" thin film whose refractive index and geometrical thickness are chosen so as to contribute to improving the optical appearance of the glazing panel in combination with the intermediate film.

Surprisingly, it has in fact turned out that to sandwich between substrate and functional film a film whose refractive index decreases progressively had an extremely positive effect on the appearance of the glazing panel in reflection, both from the purely aesthetic standpoint and from the industrial standpoint: on the one hand, the glazing panel according to the invention had a pleasing colour in reflection "on the films side", most particularly within the blue range, this colour being highly attenuated, "washed with white", and moreover devoid of any shiny appearance as it is associated with a highly desirable value of light reflection. These "anti-reflection" and "anti-colour" effects are moreoever accentuated by the presence of the "external" coating mentioned above.

However, in addition, it has been noticed that this intermediate film specific to the invention made it possible to improve both the stability and the uniformity of the appearance of the glazing panel in reflection.

This is because it is known that, depending on the chosen method of thin-film deposition manufacture, tolerances in the thicknesses of the films are fixed, outside which tolerances the eye very clearly perceives variations in appearance from one glazing panel to another or from one region of a glazing panel to another. These variations are caused, in an interferential way, by irregularity in the thickness of the films and most particularly in the thickness of the functional film. However, it has turned out that the intermediate film specific to the invention very substantially attenuated these variations in appearance, which made it possible, depending on the method of deposition chosen, to decrease significantly the glazing panel scrap rate after deposition of the films because of iridescence or defects in the optical appearance, or, conversely, made it possible to adopt less draconian manufacturing tolerances with regard to the film thicknesses, which is advantageous from the standpoint of the quality of the glazing panels or of the profitability of their manufacture.

Preferably, the total variation in refractive index within the thickness of the intermediate film according to the invention is chosen to have a value at least equal to 0.2, and especially between 0.25 and 0.80.

Thus, the lowest refractive index in this index gradient is preferably between 1.45 and 1.60 while the highest refractive index is preferably between 1.70 and 2.35. The difference between the lowest index and the highest index is in fact to be chosen to be relatively large in order to obtain the advantageous effects of the invention in an optimal way.

A preferred method of producing this index gradient consists in decreasing the refractive index of the intermediate film from a value close to the refractive index of the functional film to a value close to the refractive index of the substrate.

As regards the geometric thickness of the intermediate film, this is preferably chosen to be between 30 and 120 nm, for example between 40 and 120 nm, especially between 45 and 90 nm, or between 50 and 100 nm. The thickness must in fact be sufficient to be able to actually produce the index gradient.

There are various possible ways of creating this index gradient. The simplest is to obtain it by progressively varying the chemical composition of the intermediate film throughout its thickness, especially by mixing at least two components having different refractive indices, the amount of component or mixture of components having the highest index (or indices) gradually decreasing through its thickness. The choice of these components may, for example, be as follows: for the low-index component silicon oxide, silicon oxynitride or silicon oxycarbide is suitable and for the higher-index components tin oxide, titanium oxide, zirconium oxide, aluminium oxide, magnesium oxide, vanadium oxide, silicon oxycarbide or silicon nitride, or a mixture of at least two of these compounds, is suitable.

This gradient may be obtained using a vacuum technique or by pyrolysis, most especially by pyrolysis in the gas phase. To do this, a particularly suitable gas feed nozzle has been designed according to the invention. This nozzle is placed above the glass, transversely to its running direction, when it is in the form of a ribbon of float glass, and is preferably placed within the actual chamber of the float bath. It includes a first upstream heel-piece, a second upstream heel-piece, a central profiled block and a downstream heel-piece. A first precursor-gas injection slot is made between the two upstream heel-pieces and a second injection slot is made between the central block and the downstream heel-piece. A slot for evacuating the unreacted gaseous effluent is provided between the central profiled block and the downstream heel-piece. Thus, all these slots and the lower faces of the heel-pieces and of the central block guide the gas streams supplying the two injection slots along the glass in a deposition zone, with a flow path having approximately the shape of a U. In order to create partial and progressive mixing between these two gas streams in the deposition zone, and thus to create the desired composition gradient, certain geometric parameters of the nozzle are adjusted. The two important parameters are, on the one hand, the distance 1 between the injection slots and, on the other hand, the relative configurations of the two upstream heel-pieces and the central block. Consequently, in order to achieve the desired effect, the preferred embodiment consists in the lower face of the central block being at a higher level than that of the second upstream heel-piece which is adjacent to it and the lower face of this second upstream heel-piece itself being at a higher level than that of the first upstream heel-piece.

With regard to the distance 1 between the two injection slots, it is advantageous to choose it to be at most equal to ¾ of the total length of the deposition zone, especially approximately ¼ to ⅔ of the said length.

In order to obtain the desired decreasing refractive index gradient in order to manufacture the intermediate film according to the invention, it is then necessary to supply the first injection slot with the reactive mixture which pyrolyzes in the form of an oxide of a given refractive index, having the highest index ($TiO_2$, $SnO_2$, $ZrO_2$, MgO, $V_2O_5$, $SiO_xC_y$, $Si_3N_4$, a mixture of at least two of the oxides or of at least one of these oxides with $Al_2O_3$), the second injection slot being supplied with the reactive mixture which pyrolyzes in the form of the oxide having the lowest index (such as $SiO_2$).

Of course, it is necessary to reverse the situation if it is desired, on the other hand, to obtain an increasing index gradient.

The invention also relates to the process in which such a nozzle is employed, and the glazing panels obtained by the said process.

With regard to the so-called "external" thin film previously mentioned, lying above the functional film, this is preferably chosen to have a refractive index of between 1.4 and 1.7 and a geometric thickness of between 70 and 120 nm. This is because with such characteristics the optimum optical appearance is obtained, especially the greatest reduction in light reflection $R_L$ and therefore, consequently, the greatest increase in light transmission $T_L$. In order to form it, it is possible to choose various dielectric materials, especially those based on at least one of the following components: silicon oxide, silicon oxynitride, silicon oxycarbide, aluminium oxide or a mixture of silicon oxide and aluminium oxide, also containing a halide of the fluorine type.

In order to manufacture this film, recourse may be made to a vacuum deposition technique, especially of the reactive or non-reactive sputtering type. It is also possible to use pyrolysis techniques, most particularly in the gas phase, also called CVD ("Chemical Vapour Deposition"), especially for the continuous deposition on float glass, using organosilicon precursors combined with an oxidizing gas such as oxygen (or any other more weakly oxidizing gas, such as $H_2O$ or $N_2O$) in an inert diluting gas of the nitrogen type, such as diethylsilane $Si(CH_3)_2H_2$ hexamethyldisilane $(CH_3)_3$—Si—Si $(CH_3)_3$, tetraethylortho-silicate Si $(OC_2H_5)_4$, hexamethyldisiloxane $(CH_3)_3$—Si—O—Si $(CH_3)_3$, octamethylcyclotetrasiloxane $((CH_3)_2SiO)_4$, tetramethylcyclotetrasiloxane $(CH_3HSiO)_4$ as well as hexamethyldisilazane or tetramethylsilane and/or using known organometallic precursors, especially those having an alkoxide or β-diketone functional group. It is also possible to adopt a deposition technique using powder or liquid-phase pyrolysis. For more details on the structure and methods of obtaining this "external" film, reference may advantageously be made to the aforementioned PCT patent application WO-94/25410 and to the French patent application FR-94/13911 corresponding to the European patent EP-0,712,815.

The functional film according to the invention is, for example, of the type of those described in the aforementioned patent applications. Thus, it generally has a refractive index of approximately 1.8 to 2 and, in order to guarantee a sufficient level of thermal and electrical performance, a geometric thickness of at least 300 nm and especially between 350 and 550 nm. It may be based on doped metal oxide(s), for example of the tin-doped indium oxide ITO, fluorine-doped tin oxide $F:SnO_2$, indium-doped zinc oxide In:ZnO, fluorine-doped zinc oxide F:ZnO, aluminium-doped zinc oxide Al:ZnO or tin-doped zinc oxide Sn:ZnO type.

This film may be manufactured using a vacuum deposition technique of the reactive or non-reactive sputtering type, or by means of a pyrolysis technique, especially the pyrolysis of pulverulent compounds, particularly when the film is made of $F:SnO_2$ or of ITO, this being preferably carried out continuously, directly on the ribbon of float glass.

Using powder pyrolysis, it is possible to manufacture the $F:SnO_2$ films using dibutyltin oxide (DBTO) in powder form and gaseous anhydrous hydro-fluoric acid, as described in the patent FR-2,380,997, using dibutyltin difluoride (DBTF), possibly as a mixture with DBTO as described in the document EP-A-178,956 or EP-A-039,256.

With regard to the films of ITO, they may be obtained, for example, using indium formate and a tin compound such as DBTO described in the document EP-A-192 009.

It is also possible to obtain the $F:SnO_2$ films by chemical vapour deposition or CVD, especially using a mixture of tin compounds such as $(CH_3)_2SnCl_2$, $(C_4H_9)_2SnCl_2$, $Sn(C_2H_5)_4$ and of organofluorine compounds such as $CCl_2F_2$, $CHClF_2$ and $CH_3CHF_2$ as described in the patent application EP-A-027,403, or else using monobutyltrichlorotin and a compound such as chlorodifluoromethane mentioned in the patent application EP-A-121,459, or tin tetrachloride $SnCl_4$.

The $F:SnO_2$ films may also be obtained in liquid phase using tin acetylacetonate or dimethyltin-2-propionate in suitable organic solvents, as described especially in the French FR-2,211,411.

The films of indium-doped or aluminium-doped zinc oxide may also be obtained by chemical vapour deposition using diethylzinc or zinc acetate and triethylindium, indium chloride or triethylaluminium, aluminium chloride, as described in patent application EP-A-385,769.

With the intermediate film according to the invention, possibly combined with the external film, the stacks of thin films according to the invention therefore exhibit very high performance from the thermal, aesthetic and optical standpoint. The glazing panels obtained exhibit high light transmission, for example at least 75%, especially at least 80 to 85%, a low light reflection, a residual colour in reflection, "on the films side", in the blues, the saturation $C^*$ in the calorimetric system $(L^*, a^*, b^*)$ of which residual colour is at most equal to 5. Finally, the emissitivity of the glazing panel is greatly lowered, with ε values of at most 0.18.

When they are mounted as double glazing, they thus achieve light transmission values of at least 70%.

The monolithic substrates as coated according to the invention may advantageously be incorporated into laminated glazing panels or into insulating multiple glazing of the double-glazing type. In the latter case, the substrate with its films is placed in the double glazing so that, once it has been mounted as the curtain walling of a building, the films lie at face 3 (the faces of the substrates in all multiple glazing are conventionally denoted going from the outside inwards).

As already mentioned, any type of deposition technique may be used to deposit the functional film, its intermediate film and possibly its outer film. In particular, at least one of the films, when it is based on metal oxide(s) may be deposited by a vacuum technique, especially by sputtering, possibly reactive sputtering in the presence of oxygen, using targets made of metal alloy or of ceramic of suitable compositions.

However, for depositing at least one of the films, it is preferred to use a solid, liquid or gas pyrolysis technique as already mentioned, as this type of technique allows continuous deposition on a ribbon of glass.

However, for depositing at least one of the films, it is preferred to use a solid, liquid or gas pyrolysis technique as already mentioned, as this type of technique allows continuous deposition on a ribbon of glass.

Thus, a preferred embodiment for obtaining the stack according to the invention consists in carrying out the first deposition of the intermediate film by CVD on the ribbon of glass in the float chamber, then in depositing the functional film by CVD, especially also in the float chamber, or by the pyrolysis of pulverulent compounds, between the float chamber and the annealing lehr, and finally in depositing the external layer, either by CVD before the annealing lehr or in the annealing lehr, or by the pyrolysis of powder(s) just after deposition of the functional film.

Further details and advantageous characteristics will emerge from the following description of non-limiting illustrative embodiments with the help of the following drawings.

Figure 2:
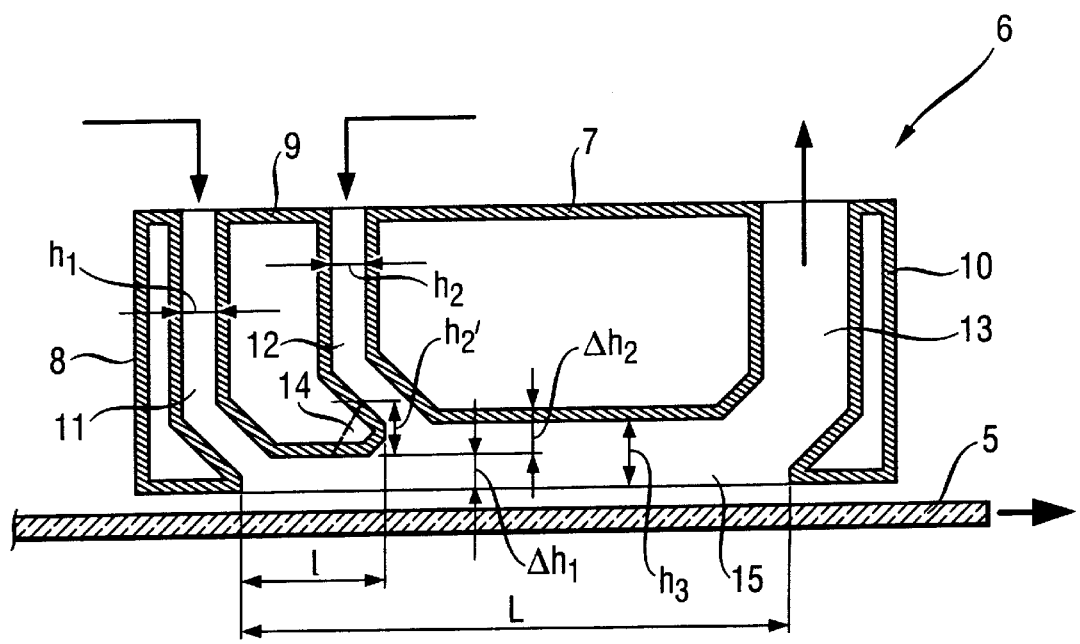
FIG. 2 is a cross-section through a CVD nozzle adapted for deposition of the graded-index intermediate film according to the invention.

It should be pointed out that both FIG. 1 and FIG. 2 are highly diagrammatic representations which do not scrupulously respect the relative proportions between the various materials/elements illustrated, in order to make them easier to examine.

EXAMPLES 1 to 7

Examples 1 to 7 are produced according to the invention and are the result of mathematical modelling. They model, in accordance with FIG. 1, a substrate 1 made of clear soda-lime silicate glass 4 mm in thickness. This is coated with an $F:SnO_2$-based low-emissivity film 3 obtained in a known way by powder pyrolysis using DBTF, as described in the aforementioned patents, and then with an external film 4 based on a mixed silicon and aluminium oxide, also with fluorine, this film also being obtained in a known way by CVD using tetraorthosilicate TEOS, aluminium hexafluoro-acetylacetonate and oxygen, in accordance with the teaching of the French application FR-94/13911 published under the number FR-2 727 107 corresponding to the patent EP-0, 712,815. Sandwiched between the substrate 1 and the functional film 3 is an intermediate film 2 having a decreasing refractive index gradient, that is to say the refractive index of which progressively decreases through its thickness from its interface with the glass 1 to its interface with the $F:SnO_2$ film 3. In order to obtain this gradient, the chemical composition of the film is gradually modified through its thickness, this film consisting of a mixture of oxides whose proportion of the components having the highest refractive index (or indices) progressively decreases. To do this, a CVD deposition technique is chosen, employing the feed nozzle illustrated in FIG. 2 and described in detail subsequently, using suitable silicon and organometallic precursors. The low-index component of the intermediate film 2 is in this case silicon oxide and its gaseous precursor may be chosen especially from tetraethylorthosilicate TEOS, silane $SiH_4$ or tetramethylsilane $Si(CH_3)_4$, which is (are) combined with an oxidizing precursor of the $O_2$, $N_2O$ or $H_2O$ type.

The higher-index components may be made of tin oxide, using monobutyltin trichloride or dibutyltin diacetate as gaseous precursors; of titanium oxide, using a titanium alkoxide of the titanium tetraisopropylate type as gaseous precursors; of zirconium oxide using a zirconium acetylacetonate, such as Zr hexafluoroacetylacetonate, or zirconium tetrabutoxide as gaseous precursors; or finally of aluminium oxide using aluminium acetylacetonate or aluminium hexafluoroacetylacetonate as gaseous precursors. Magnesium oxide MgO may also be used, in this case a gaseous precursor of the magnesium acetylacetonate, magnesium ethylate, magnesium hexafluoroacetylacetonate or magnesium trifluoroacetylacetonate type being employed. It is also possible to choose vanadium oxide $V_2O_5$ which may be obtained from a vanadium alkoxide such as vanadium tetraethylate or from a halide such as $VCl_5$ or an oxichloride such as $VOCl_3$. Silicon oxycarbide $SiO_xC_y$ may also be used, the refractive index of which is adjusted by varying its carbon content. The precursors may be especially a mixture of silane, of ethylene and of an oxidizing agent such as $O_2$, $H_2O$ or $N_2O$. Finally, silicon nitride $Si_3N_4$ may also be chosen, which may be obtained from a gaseous mixture of silane and of ammonia and/or amine.

The embodiment used for these examples is a two-component system in which the composition of the intermediate film varies from a composition close to that of tin oxide to a composition close to that of silicon oxide.

However, another two-component system of the $SiO_2/MgO$, $SiO_2/V_2O_5$, $SiO_2/TiO_2$, $SiO_2/ZrO_2$, $SiO_2/SiO_xC_y$ or $SiO_2/SiC$ type is also suitable as is a three-component system which starts, for example, with an $Al_2O_3/TiO_2$ mixture close to the glass in order to end up with a composition of the $SiO_2$ type.

In all these examples, the functional film 2 has a geometric thickness of 410 nm and the external film 4 has a geometric thickness of approximately 93 nm.

Table 1 below summarizes, for each of these examples, the geometric thickness t of the intermediate film, its total refractive index variation through its thickness, denoted by Δri, as well as its lowest index, close to the functional film 3, denoted by ri (min), and its highest index, on the substrate 1 side denoted by ri (max).

TABLE 1

|  | t | Δri | ri (min) | ri (max) |
|---|---|---|---|---|
| Example 1 | 60 nm | 0.35 | 1.50 | 1.85 |
| Example 2 | 60 nm | 0.30 | 1.50 | 1.80 |
| Example 3 | 60 nm | 0.25 | 1.50 | 1.75 |
| Example 4 | 60 nm | 0.5 | 1.45 | 1.95 |
| Example 5 | 60 nm | 0.21 | 1.63 | 1.84 |
| Example 6 | 54 nm | 0.35 | 1.45 | 1.80 |
| Example 7 | 66 nm | 0.35 | 1.45 | 1.80 |

Collated hereinbelow in Table 2 are spectrophotometric data measured using the $D_{65}$ illuminant with regard to all the coated substrates according to these examples. The abbreviations used which summarize the calorimetric properties of the substrates in reflection, on the "films side", have the following meanings:

a*, b* are the factors in the (L*, a*, b*), colorimetr c system;

C* is, still in this system, the saturation value equal to $(a^{*2}+b^{*2})^{1/2}$;

ΔC* is the observed saturation variation when the thickness of the functional film 2 varies by ±50 nm about its mean value of 410 nm. All the coated substrates according to the examples have, moreover, a high light transmission $T_L$ of about 86% and a low light reflection on the "films side" of about 4 to 5%.

TABLE 2

|  | a* | b* | C* | ΔC* |
|---|---|---|---|---|
| Example 1 | 1.6 | −4.0 | 4.3 | 2 |
| Example 2 | 1.9 | −4.4 | 4.8 | 2.4 |
| Example 3 | 1.7 | −5.0 | 5.1 | 2.3 |
| Example 4 | 2.6 | −4.3 | 5 | 3.6 |
| Example 5 | 1.9 | −3.8 | 4.2 | 3.3 |
| Example 6 | 1.6 | −5.2 | 5.4 | 3.2 |
| Example 7 | 2.4 | −5.8 | 6.2 | 2.4 |

COMPARATIVE EXAMPLES 8 AND 9

These two comparative examples model a substrate 1, a functional film 3 and an external film 4 having the same characteristics as in the preceding examples.

On the other hand in the case of Example 8, the intermediate film 2 consists of an $SiO_xC_y$ material obtained as described in the aforementioned patent application EP-0, 573,325, having a constant refractive index through its thickness, of approximately 1.75, and a geometric thickness equal to 60 nm.

In the case of Example 9, the intermediate film 2 is based on an $SiO_2/SnO_2$ mixture, but one having an increasing and not a decreasing refractive index gradient—its index varies from approximates 1.45 close to the glass (pure SiO2) to approximately 1.85 (mostly $SnO_2$) close to the $F:SnO_2$ film—and having a geometric thickness of 60 nm.

Table 3 below indicates for these two comparative examples the same photometric data as in Table 2 above:

TABLE 3

|  | a | b* | C* | C* |
|---|---|---|---|---|
| Comparative Example 8 | 0.8 | −7.2 | 7 | 6 |
| Comparative Example 9 | 0.5 | −5.5 | 5.6 | 5 |

Various comments may be made with regard to these results.

Table 2 shows that all the coated substrates according to the invention have in reflection, "on the films side", a blue colour (slightly positive a* and negative b*), which value is found when these coated substrates are mounted as double glazing so as to have the thin films as face 3.

This is therefore an attractive and not very intense colour since the saturation value associated with it remains at most approximately 5.

Although, from Table 3, the coated substrates according to the comparative examples also have a colour in the blue-violet, the tint is, on the other hand, more intense since their saturation clearly exceeds this value of 5.

But what especially emerges from comparing these two tables is the fact that the saturation variations ΔC* of the examples according to the invention are much smaller than those of the comparative examples, since they remain at most approximately 3 for variations in thickness of the functional film which are far from being negligible. In fact, it goes without saying that on an industrial line the thickness of the depositions may be controlled with variations much less than ±50 nm, which means that overall, under the actual conditions of industrial production, the coated substrates according to the invention give a visual impression of very high homogeneity, the differences remaining below the eye's sensitivity threshold. This is not the case for the comparative examples.

It may also be noted that the combination of the intermediate film 2 with the external film 4 makes it possible to obtain a very pronounced anti-reflection effect with very low "films side" $R_L$ values.

Let us now return to the nozzle according to FIG. 2, which enabled the graded intermediate film to be deposited.

This figure shows a ribbon of glass 5 running in a given direction through the chamber of a float bath. Mounted above this ribbon, in a zone of the bath in which it has acquired dimensional stability, is a nozzle 6 for feeding the gaseous precursors onto the surface of the hot glass so that they react and decompose into oxides on coming into contact with it. The nozzle is placed transversely to the ribbon of glass and extends over its entire width. Only the important elements of the nozzle for carrying out the invention have been shown and will be described here. (For more details about the general operation, reference may be made, for example, to the patent application EP-A-499,523 or, especially, to the patent application EP-A-518,755). This figure shows a central profiled block 7, a first upstream heel-piece 8, a second upstream heel-piece 9 and a downstream heel-piece 10. These terms "upstream" and "downstream" have been chosen for convenience, they are defined in terms of the direction in which the glass runs. A first gas-precursor feed slot 11 is created between the first upstream heel-piece 8 and the second one 9, and a second precursor-gas feed slot 12 is created between the second upstream heel-piece and the central profiled block 7. Arranged between the central block 7 and the downstream heel-piece 10 is an evacuation slot 13 connected in the upper part to a suction system so as to capture the unreacted gaseous effluent. All of these slots and the lower faces of the second upstream heel-piece and of the central profiled block 7 allow the gases to be made to flow along the surface of the ribbon of glass over a length L corresponding to the deposition zone 15. In order to be able to obtain an index gradient, several conditions are to be jointly met.

Firstly, each of the slots is to be supplied with a "complete" mixture of precursor gases, that is to say possessing by itself all the components necessary for obtaining the desired oxide.

Thus, the first slot 11 is fed with the reactive mixture suitable for depositing $SnO_2$, either monobutyltin trichloride combined with a "soft" oxidizing agent of the $H_2O$ or $N_2O$ type, or dibutyltin diacetate, and carried by means of an inert carrier gas of the nitrogen type. The second slot 12 is fed with the reactive mixture suitable for depositing the lowest-index oxide, in this case $SiO_2$, i.e. TEOS also combined with a "soft" oxidizing agent of the $H_2O$ or $N_2O$ type.

However, it should be noted that modifications may be made to this principle. Thus, if the $SiO_xC_y/SiO_2$ system is chosen, and not the $SnO_2/SiO_2$ system, in order to create a graded intermediate film, it is possible to choose to supply one of the two injection slots with the "complete" mixture of precursors for making $SiO_2$, especially a mixture of TEOS and oxidizing agent in an inert gas, and the other injection slot either with the "complete" mixture of precursors for making $SiO_xC_y$, especially a mixture of $SiH_4$ +ethylene in an inert gas, or simply with ethylene, as the source of carbon, (the variation in carbon content in the film governing its index variation).

Next, it is necessary to promote the partial and controlled mixing of the two gas streams, coming from each of these slots, flowing along the glass. To do this, various geometric parameters have to be set.

On the one hand, the distance 1, measured parallel to the direction in which the glass runs, between the two feed slots 11 and 12. Here, this is chosen to have a value such that l/L=0.27 approximately.

On the other hand, the relative configuration of the various heel-pieces and of the central block is important: the nozzle is firstly placed so that the lower faces of the first upstream heel-piece 8 and of the downstream heel-piece 10 are very close to the surface of the glass, for example at a distance of 2 to 5 mm, so as to guarantee confinement of the gases in the deposition zone. Thus, the lower faces of the upstream heel-pieces and of the central block are also configured so that the second upstream heel-piece 9 is raised above the first upstream heel-piece 8 by an amount $\Delta h_1$ and so that the central block 7 is raised above the second upstream heel-piece 9 by an amount $\Delta h_2$ ($\Delta h_1 \approx \Delta h_2 \approx 4$ mm is chosen, for example).

Next, the "nose" of the second upstream heel-piece 9 is suitably configured (by "nose" of the heel-piece 9 is meant that region of the heel-piece which lies closest to the surface of the glass 5 and which delimits the point where the injection slot 12 runs out into the deposition zone 15).

In fact, the method of operating the nozzle in order to obtain the gradient is as follows: the first precursor gas stream comes from the first injection slot 11, which has a section $h_1$. The second precursor gas stream comes from the second injection slot 12, which has a section $h_2$, and the height of the deposition zone 15, measured between the plane defined by the lower faces of the first upstream heel-piece 8 and of the downstream heel-piece 10 and the central block 7, has a value $h_3$.

In order to guarantee laminar flow of the gas streams along the glass in the deposition zone 15, the following relationship is satisfied:

$$h_1 + h_2 = h_3 \quad (1)$$

(or $\Delta h_{1+\Delta h2} = h_3$, choosing here $h_1 = \Delta h_1$ and $h_2 = \Delta h_2$).

In this case, choosing $h_1 \approx h_2$, and both these heights being between 2 mm and 8 mm, especially approximately 4 mm, $h_3$ is then approximately 8 mm.

However, if the relationship (1) is satisified over the entire deposition zone, two superimposed layers, one of $SnO_2$ and the other $SiO_2$, will in fact be obtained without actually obtaining the desired gradient. In order to obtain the gradient, it is in fact necessary to create a local region of turbulence in the deposition zone 15, most particularly in the region where the second injection slot 12 runs out into this zone 15. To do this, the shape of the nose of the heel-piece 9 adopted is such that the section $h_2'$ the slot is locally widened at this point.

Suitable "nose" shapes may, for example, as shown in the figure, be bevelled shapes, with corners cut off, or more or less rounded shapes (the dotted lines in FIG. 2 indicate another type of conceivable profile).

In fact, at this point, the height of the deposition zone becomes equal to $h_1 + h_2'$, that is to greater than $h_3$.

The gas streams therefore mix partially, hence creating the gradient. In fact, the greater the local widening $h_2'$ the greater will be the mixing between the two gas streams and the greater will be the interdiffusion between the various precursors.

Therefore in region I in the deposition zone, only the tin oxide precursors are in contact with the glass and therefore a thin film of virtually pure $SnO_2$ is firstly deposited. Next, starting from the end of this region I, the two reactive mixtures reacting together, the deposition progressively becomes depleted in $SnO_2$ so as to be enriched in $SiO_2$.

The nozzle according to the invention therefore makes it possible to obtain films having a refractive index and/or chemical composition gradient. By choosing the order in which the precursors are introduced into the successive injection slots, it is thus possible to obtain films having an increasing or decreasing index through their thickness.

EXAMPLES 10 to 12

These examples were produced using the nozzle described above, by depositing, on a substrate of soda-lime silicate glass 4 mm thick, $SnO_2/SiO_2$-based films whose refractive index decreases progressively on going way from the glass.

The first slot 11 is supplied with dibutyltin diacetate DBTA and the second slot 12 with TEOS.

Table 4 below indicates, for these three examples, the ratio R of the TEOS and DBTA volume flowrates, the thickness t in nm of the film and the values, ri (min) and ri (max), according to the conventions adopted in Table 1:

TABLE 4

|  | R | t | ri (min) | ri (max) |
|---|---|---|---|---|
| Example 10 | 66 | 60 | 1.46 | 1.75 |
| Example 11 | 16 | 100 | 1.48 | 1.98 |
| Example 12 | 26 | 90 | 1.46 | 1.80 |

Figure 3:
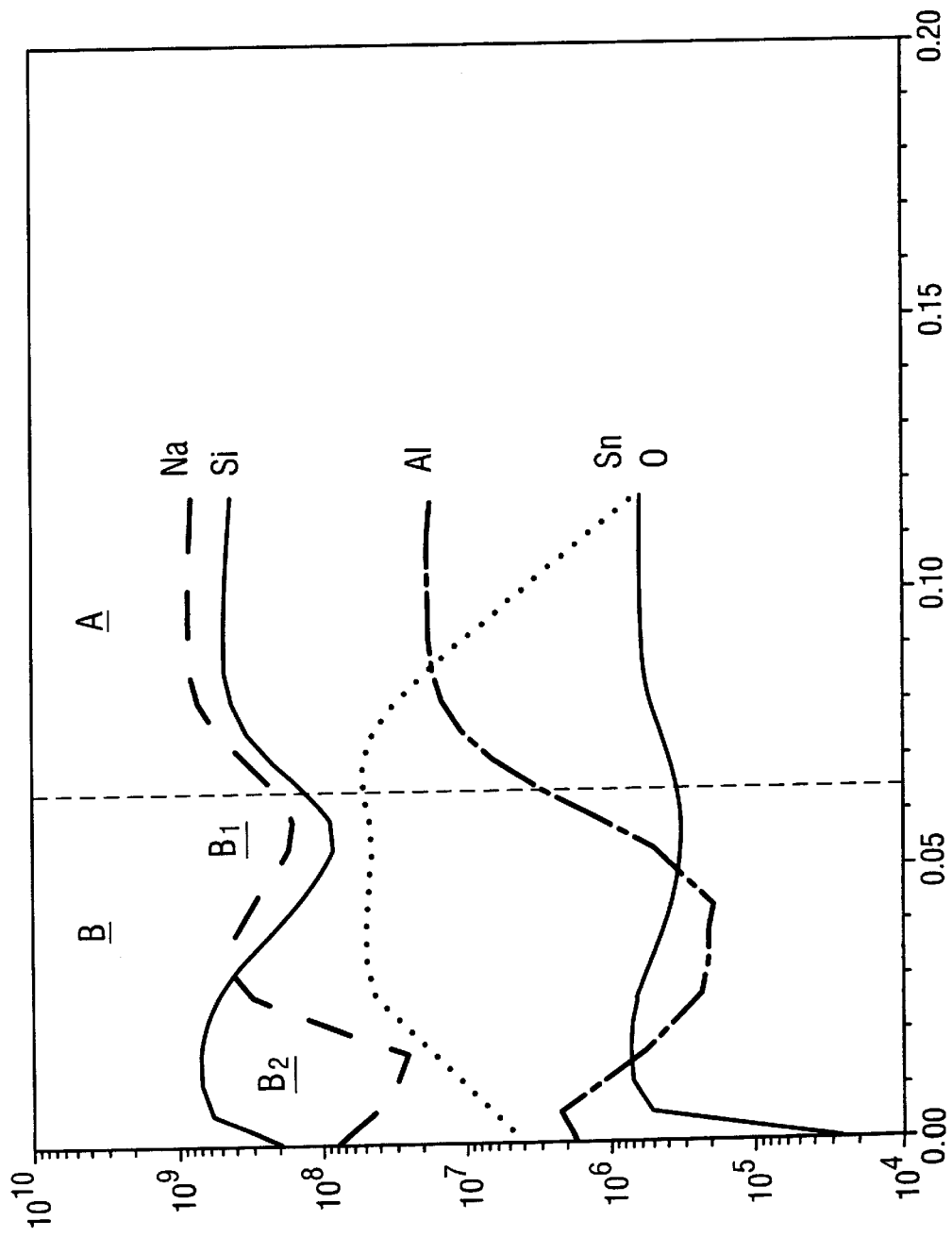
FIGS. 3 to 5 are SIMS profiles of the intermediate films according to the invention.
Figure 4:
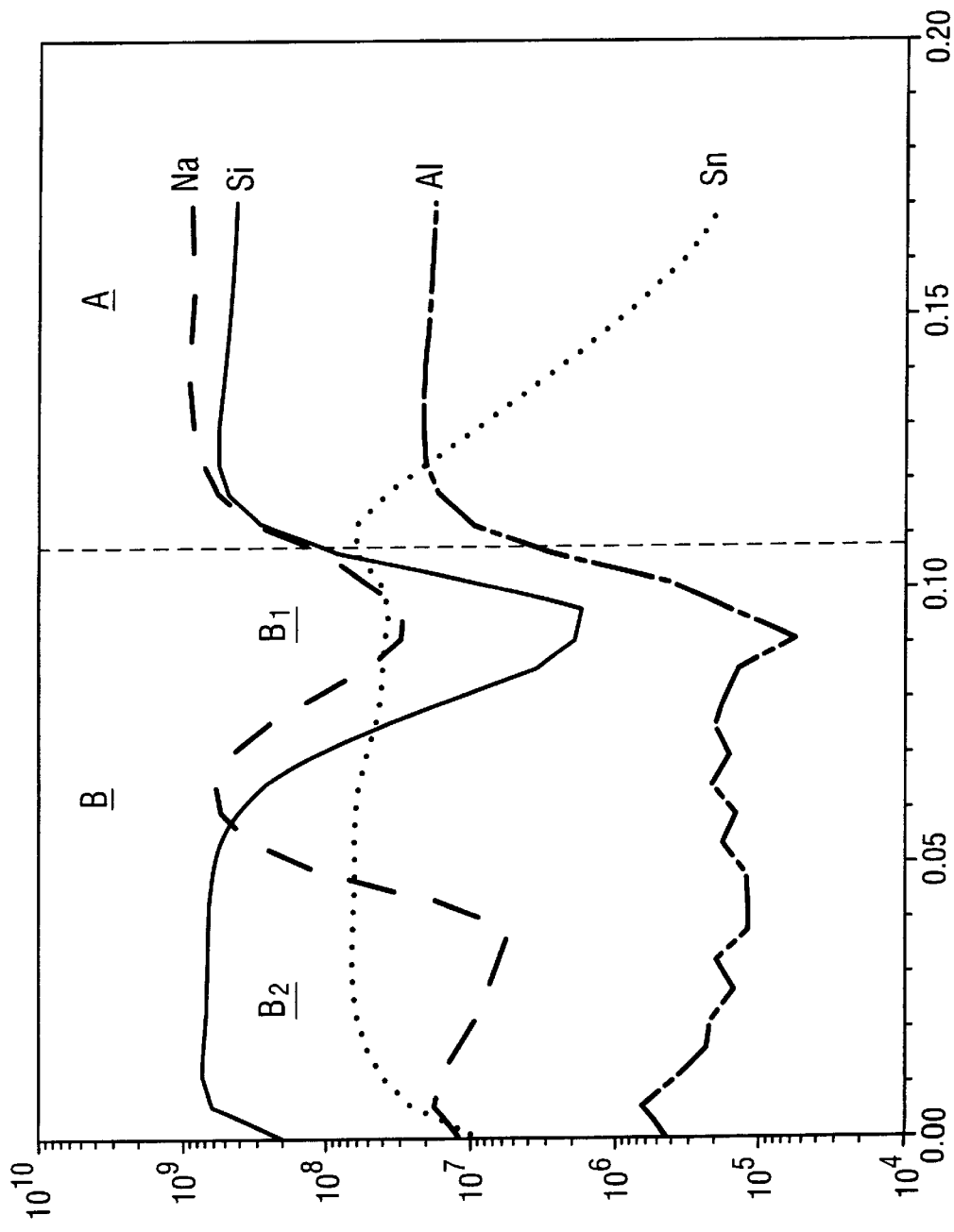
Figure 5:
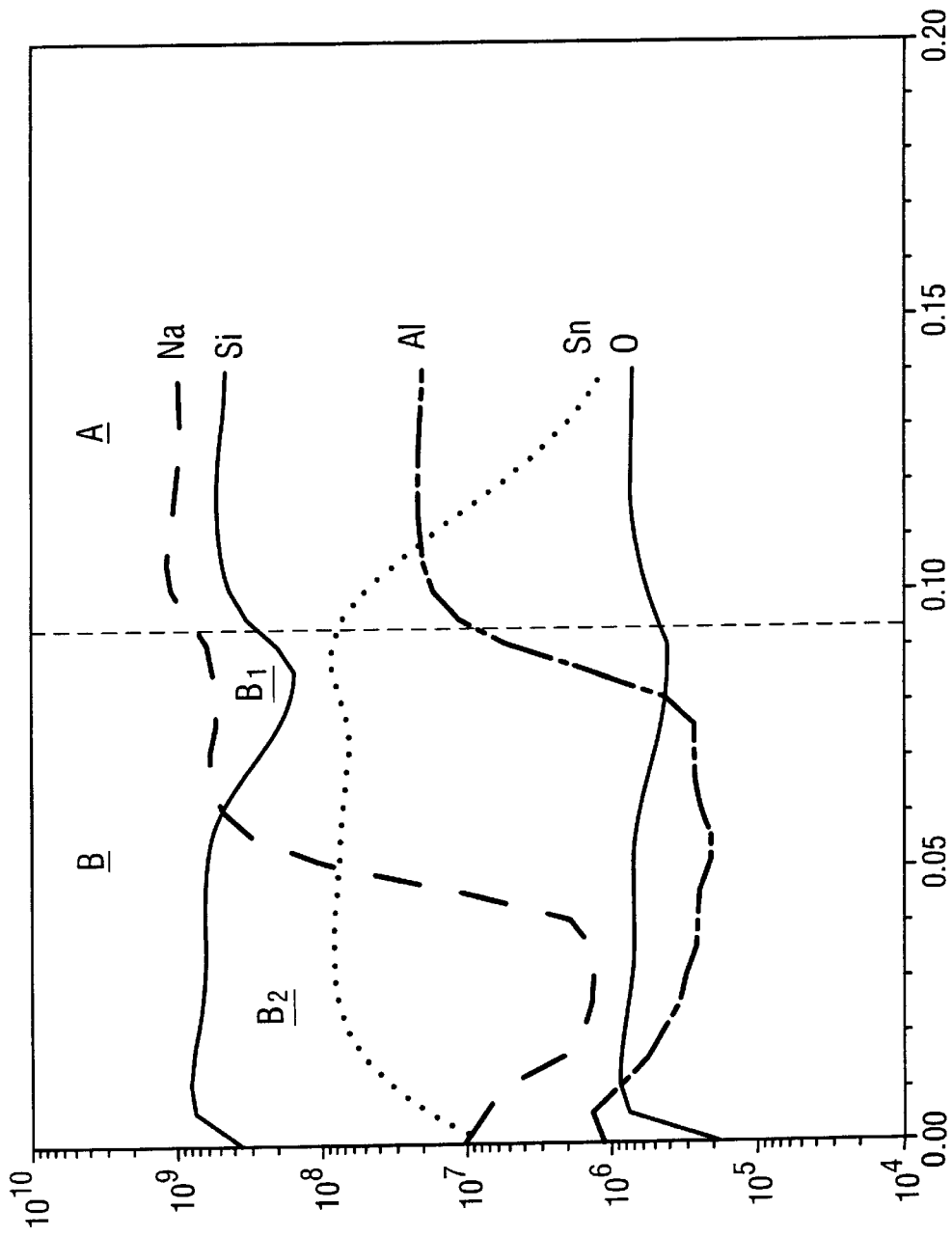

These three substrates thus coated were analyzed by SIMS (Secondary Ion Mass Spectroscopy): FIGS. 3, 4 and 5 correspond respectively to the films according to Examples 10, 11 and 12. The graphs represent, as abscissae, the depth of the analysis in micrometers and, as ordinates, the number of counts per second on a logarithmic scale.

Only the elements which are more particularly relevant to the invention are depicted in these three graphs.

By examining them, it may be seen that two regions may be distinguished, region A which corresponds to the glass and region B which corresponds to the film. Within region B, region $B_1$ is that part of the film richest in tin oxide and region $B_2$ is that part of the film richest in silicon oxide.

By examining the variations in sodium content, it may be seen that the film according to the invention, more particularly in its region $B_2$, makes it possible to form a barrier to diffusion of this element.

The aluminium content makes it possible to identify the glass/film interface.

Figure 6:
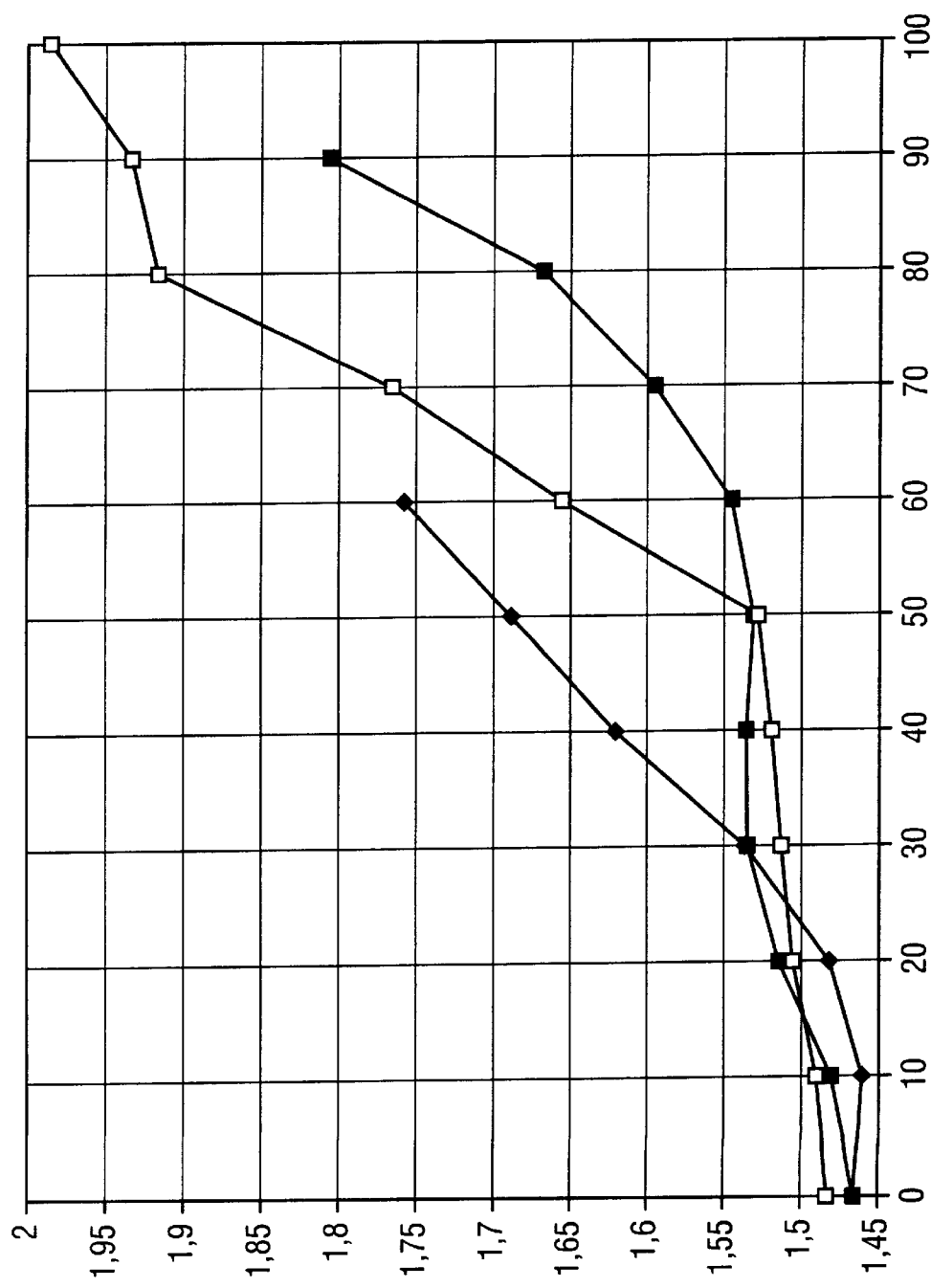
FIGS. 6 and 7 are graphs showing the index gradients and chemical compositions of the intermediate films according to the invention.
Figure 7:
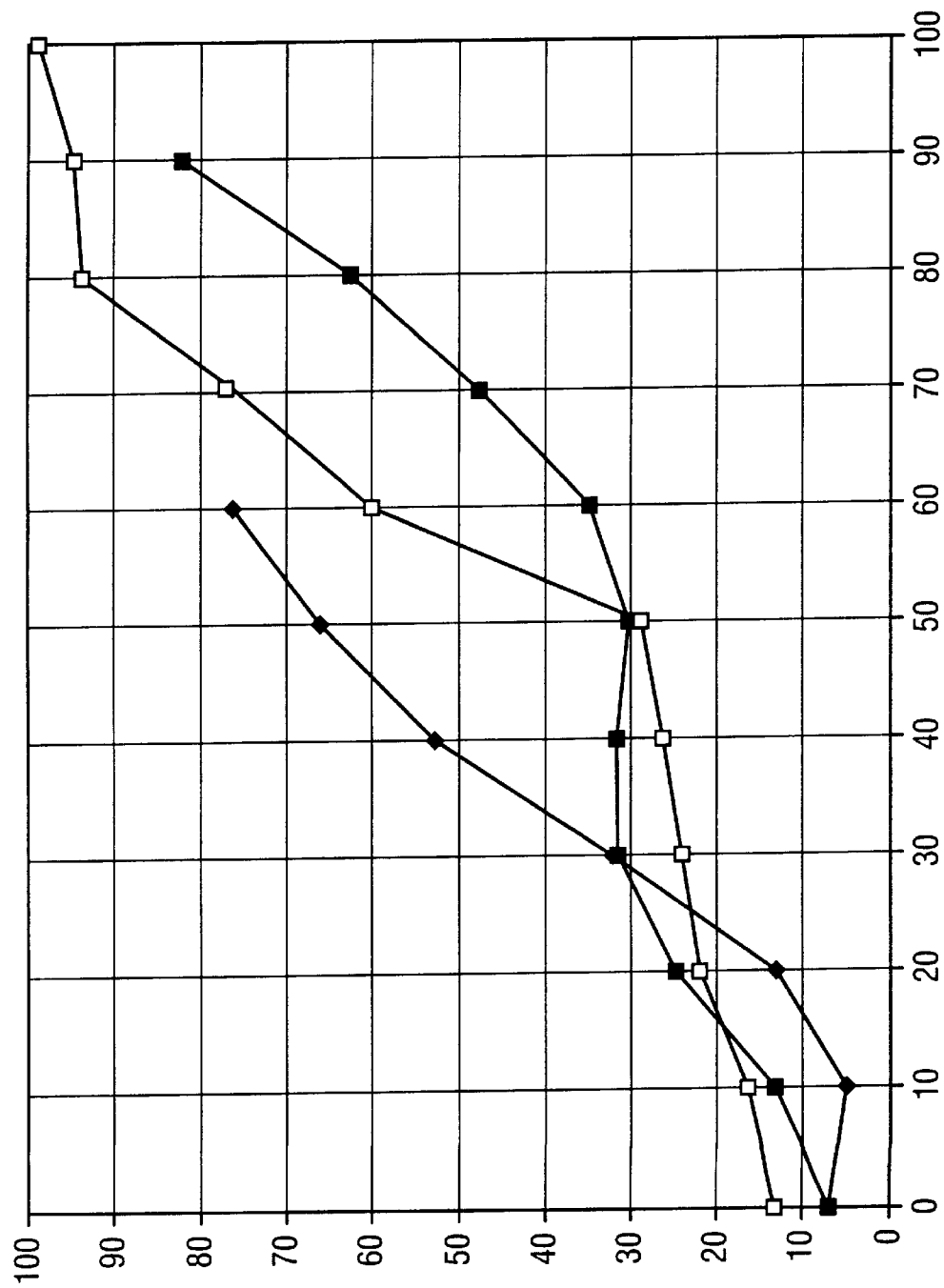

FIGS. 6 and 7 are obtained by computation from these spectroscopic analyses. In the two figures, the curves identified by the solid diamonds correspond to Example 10, those identified by open squares correspond to Example 11 and those identified by solid squares correspond to Example 12. In FIG. 6, the abscissae are the thickness of the film in nanometres and the ordinates are its refractive index. In FIG. 7, again the abscissae are the thickness of the layer in nanometres and the ordinates are the percentage by weight of $SnO_2$ in the film.

These two series of graphs clearly show the index and chemical composition gradient effect desired in the invention.

The invention lends itself to all embodiments. It is possible, in fact, to select the thickness of the film, its index or composition variation by adjusting, for example, deposition parameters such as the ratio of the precursor flowrates, the speed at which the glass runs under the nozzle, the structure of the nozzle, etc.

It is in the case of Example 11 that there is the highest index and composition gradient with, close to the interface with the glass, an $SnO_2$ content greater than 90%.

In example 12, it may be seen that even close to the glass the film already contains less than 80% of $SiO_2$.

What is claimed is:

1. In a glazing panel comprising a transparent substrate (1) provided with at least one functional, conductive and/or low-emissivity, transparent thin film (3), the improvement comprising at least one intermediate film (2) disposed between the substrate (1) and the functional film (3), said at least one intermediate film having a decreasing refractive index gradient where the refractive index decreases through its thickness from the substrate to the functional film.

2. Glazing panel according to claim 1, wherein the total refractive index variation through the thickness of the intermediate film (2) is at least 0.2.

3. Glazing panel according to claim 2, wherein the total refractive index variation through the thickness of the intermediate film (2) is between about 0.25 and 0.8.

4. Glazing panel according to claim 1 or claim 2, wherein the lowest refractive index in the index gradient of the intermediate film (2) is between about 1.45 and 1.60.

5. Glazing panel according to claim 1, wherein the highest refractive index in the index gradient of the intermediate film is between about 1.7 and 2.35.

6. Glazing panel according to claim 1, wherein the refractive index of the intermediate film (2) varies from a refractive index close to that of the functional film (3) to a refractive index close to that of the substrate (1).

7. Glazing panel according to claim 1, wherein the geometric thickness of the graded index intermediate film (2) is between 30 and 120 nm.

8. Glazing panel according to claim 7, wherein the geometric thickness of the graded-index intermediate film (2) is between about 45 and 90 nm.

9. Glazing panel according to claim 1, wherein the refractive index gradient of the intermediate film (2) is obtained by progressively varying its chemical composition through the thickness of the film.

10. Glazing panel according to claim 9, characterized in that said mixture comprises at least one low-index component of silicon oxide, silicon oxynitride or silicon oxycarbide.

11. Glazing panel according to claim 9 or claim 8, characterized in that said mixture comprises at least one high-index component, of tin oxide, titanium oxide, zirconium oxide, aluminium oxide, magnesium oxide, vanadium oxide, silicon nitride or silicon oxycarbide.

12. Glazing panel according to claim 9, wherein the chemical composition is varied providing a mixture of at least two components having different refractive indices, with the amount of the component or mixture of components having the highest index gradually decreasing through the thickness of the film.

13. Glazing panel according to claim 1, characterized in that the functional film (3) is coated with at least one external thin film (4) having a refractive index between 1.4 and 1.7 and a geometric thickness between about 70 and 120 nm.

14. Glazing panel according to claim 13, characterized in that said external film (4) is made of a dielectric material at least one of the compounds of the group comprising silicon oxide, silicon oxycarbide, silicon oxynitride, aluminium oxide or a mixture of mixed silicon and aluminium oxide and containing fluorine.

15. Glazing panel according to claim 1, wherein the functional film (3) has a refractive index of approximately 1.8 to 2 and a geometric thickness of at least 300 nm.

16. Glazing panel according to claim 15, wherein the functional film (3) has a geometric thickness between about 350 and 550 nm.

17. Glazing panel according to claim 1, characterized in that the functional film (3) is a doped metal oxide(s) belonging to the group comprising tin-doped indium oxide ITO, fluorine-doped tin oxide $F:SnO_2$, indium-doped zinc oxide In:ZnO, fluorine-doped zinc oxide F:ZnO, aluminium-doped zinc oxide Al:ZnO or tin-doped zinc oxide Sn:ZnO.

18. Glazing panel according to claim 1, wherein a residual colour is disposed, in reflection, on the films side, said residual colour being in the blues, the saturation $C^*$ in the ($L^*$, $a^*$, $b^*$) colorimetric system of this residual colour is at most equal to 5, a high light transmission $T_L$ of at least 75%, and an emissivity $\epsilon$ of at most 0.18.

19. Glazing panel according to claim 18, wherein the high light transmission $T_L$ is at least 80 to 85%.

20. Glazing panel according to claim 1, wherein the transparent substrates are made of glass.

* * * * *

UNITED STATES PATENT AND TRADEMARK OFFICE
CERTIFICATE OF CORRECTION

PATENT NO. : 6,174,599 B1  Page 1 of 1
DATED : January 16 2001
INVENTOR(S) : Philippe Boire et al.

It is certified that error appears in the above-identified patent and that said Letters Patent is hereby corrected as shown below:

Column 13, claim 11,
Line 12, change "claim 8," to -- claim 10, --.
Line 14, after "component", delete -- , --.

Column 13, claim 14,
Line 29, after "material" and before "at", insert -- of --.

Signed and Sealed this

Fifth Day of February, 2002

Attest:

JAMES E. ROGAN
*Attesting Officer*   *Director of the United States Patent and Trademark Office*